(12) United States Patent
Zhu et al.

(10) Patent No.: US 7,696,025 B2
(45) Date of Patent: Apr. 13, 2010

(54) SIDEWALL SEMICONDUCTOR TRANSISTORS

(75) Inventors: Huilong Zhu, Poughkeepsie, NY (US); Lawrence A. Clevenger, LaGrangeville, NY (US); Omer H. Dokumaci, Wappingers Falls, NY (US); Kaushik A. Kumar, Beacon, NY (US); Carl J. Radens, LaGrangeville, NY (US); Dureseti Chidambarrao, Weston, CT (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 11/867,840

(22) Filed: Oct. 5, 2007

(65) Prior Publication Data
US 2008/0286909 A1   Nov. 20, 2008

Related U.S. Application Data

(62) Division of application No. 10/905,041, filed on Dec. 13, 2004, now Pat. No. 7,397,081.

(51) Int. Cl.
*H01L 21/00* (2006.01)
*H01L 21/84* (2006.01)
(52) U.S. Cl. ............... 438/151; 438/154; 438/155; 438/156; 257/E21.4
(58) Field of Classification Search ............... 257/288, 257/328; 365/177; 438/302, 151
See application file for complete search history.

(56) References Cited

U.S. PATENT DOCUMENTS

| 5,281,547 | A | * | 1/1994 | Uchiyama et al. ........... 438/302 |
| 5,512,517 | A | * | 4/1996 | Bryant ...................... 438/302 |
| 6,903,967 | B2 | * | 6/2005 | Mathew et al. ............. 365/177 |
| 7,105,390 | B2 | | 9/2006 | Brask et al. |
| 2006/0065914 | A1 | * | 3/2006 | Chen et al. ................. 257/288 |

FOREIGN PATENT DOCUMENTS

CN            1141509            1/1997

* cited by examiner

*Primary Examiner*—Thanh V Pham
*Assistant Examiner*—Errol Fernandes
(74) *Attorney, Agent, or Firm*—Schmeiser, Olsen & Watts; Steven Capella

(57) ABSTRACT

A novel transistor structure and method for fabricating the same. First, a substrate, a semiconductor region, a gate dielectric region, and a gate block are provided. The semiconductor region, the gate dielectric region, and the gate block are on the substrate. The gate dielectric region is sandwiched between the semiconductor region and the gate block. The semiconductor region is electrically insulated from the gate block by the gate dielectric region. The semiconductor region and the gate dielectric region share an interface surface which is essentially perpendicular to a top surface of the substrate. The semiconductor region and the gate dielectric region do not share any interface surface that is essentially parallel to a top surface of the substrate. Next, a gate region is formed from the gate block. Then, first and second source/drain regions are formed in the semiconductor region.

19 Claims, 8 Drawing Sheets

SIDEWALL SEMICONDUCTOR TRANSISTORS

This application is a divisional application claiming priority to Ser. No. 10/905,041, filed Dec. 13, 2004.

BACKGROUND OF THE INVENTION

1. Technical Field

The present invention relates to semiconductor transistors, and more particularly, to sidewall semiconductor transistors.

2. Related Art

In a typical semiconductor transistor, there exist capacitances between the gate contact region and the source/drain contact regions of the transistor. It is desirable to minimize these capacitances. Therefore, there is a need for a novel transistor structure in which the capacitances between the gate contact region and the source/drain contact regions of the transistor are reduced. There is also a need for a method for fabricating the novel transistor structure.

SUMMARY OF THE INVENTION

The present invention provides a semiconductor structure, comprising (a) a substrate; and (b) a semiconductor region, a gate dielectric region, and a gate region on the substrate, wherein the gate dielectric region is sandwiched between the semiconductor region and the gate region, wherein the semiconductor region is electrically insulated from the gate region by the gate dielectric region, wherein the semiconductor region comprises a channel region and first and second source/drain regions, wherein the channel region is sandwiched between the first and second source/drain regions, wherein the first and second source/drain regions are aligned with the gate region, wherein the channel region and the gate dielectric region share an interface surface which is essentially perpendicular to a top surface of the substrate, and wherein the semiconductor region and the gate dielectric region do not share any interface surface that is essentially parallel to a top surface of the substrate.

The present invention also provides a method for fabricating a semiconductor structure, the method comprising (a) providing a substrate, a semiconductor region, a gate dielectric region, and a gate block, wherein the semiconductor region, the gate dielectric region, and the gate block are on the substrate, wherein the gate dielectric region is sandwiched between the semiconductor region and the gate block, wherein the semiconductor region is electrically insulated from the gate block by the gate dielectric region, wherein the semiconductor region and the gate dielectric region share an interface surface which is essentially perpendicular to a top surface of the substrate, and wherein the semiconductor region and the gate dielectric region do not share any interface surface that is essentially parallel to a top surface of the substrate; and (b) forming a gate region from the gate block; and (c) forming first and second source/drain regions in the semiconductor region, wherein the first and second source/drain regions are aligned with the gate region.

The present invention also provides a method for fabricating a semiconductor structure, the method comprising (a) providing a substrate, a semiconductor region, a gate dielectric region, and a gate block, wherein the semiconductor region, the gate dielectric region, and the gate block are on the substrate, wherein the gate dielectric region is sandwiched between the semiconductor region and the gate block, wherein the semiconductor region is electrically insulated from the gate block by the gate dielectric region, wherein the semiconductor region and the gate dielectric region share an interface surface which is essentially perpendicular to a top surface of the substrate, and wherein the semiconductor region and the gate dielectric region do not share any interface surface that is essentially parallel to a top surface of the substrate; and (b) forming a gate region from the gate block; and (c) using a mask comprising the gate region to form first and second source/drain regions in the semiconductor region The present invention provides a novel transistor structure in which the capacitances between the gate contact region and the source/drain contact regions of the transistor are reduced. The present invention also provides a method for fabricating the novel transistor structure.

DETAILED DESCRIPTION OF THE INVENTION

Figure 1A:
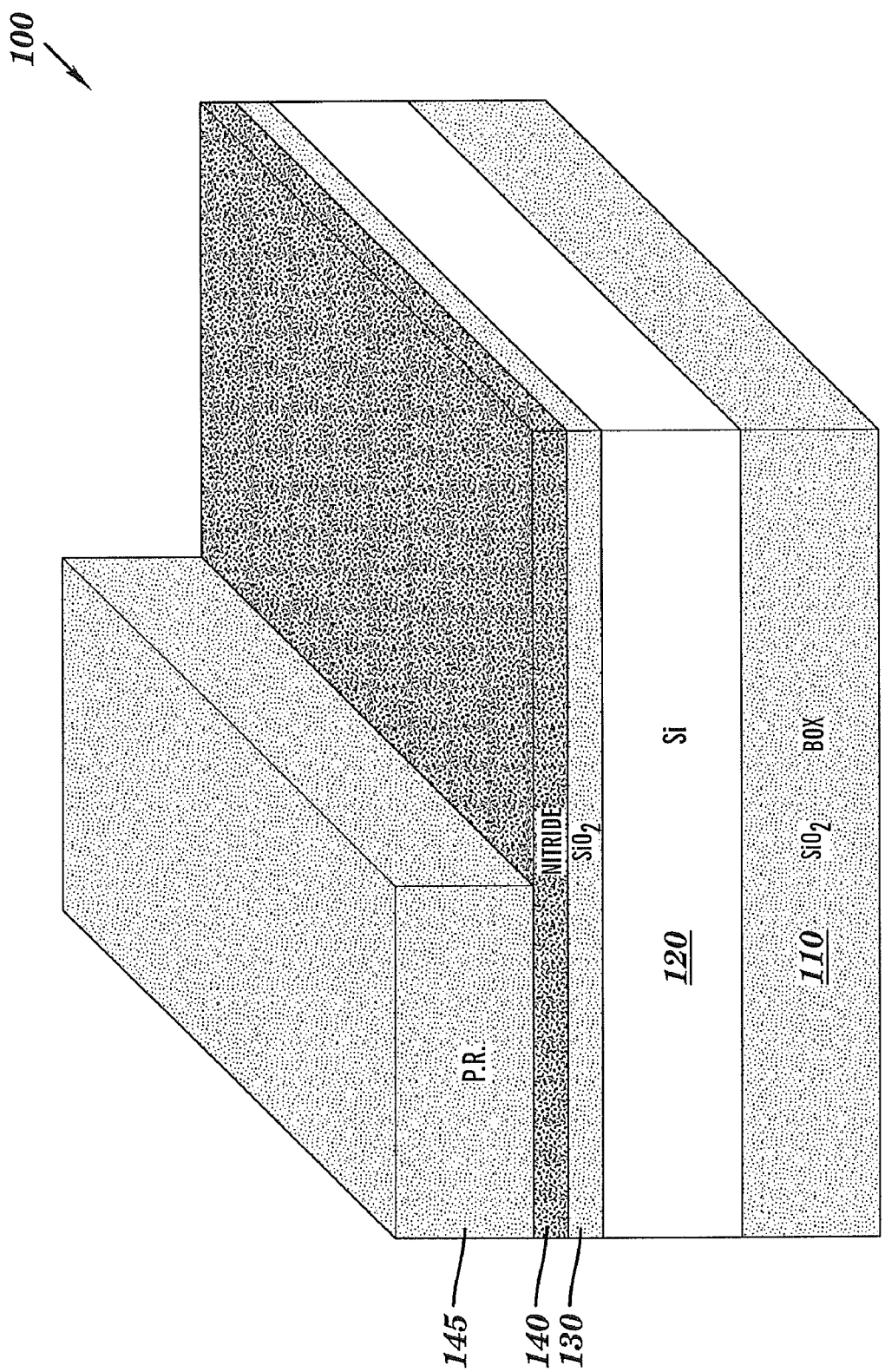
FIGS. 1A-1G show perspective views of a semiconductor structure used to illustrate a transistor fabrication method, in accordance with embodiments of the present invention.

FIGS. 1A-1G show perspective views of a semiconductor structure 100 used to illustrate a transistor fabrication method, in accordance with embodiments of the present invention. More specifically, with reference to FIG. 1A, in one embodiment, the method starts out with providing a substrate 110. In one embodiment, the substrate 110 can comprise a dielectric material such as silicon dioxide.

Next, in one embodiment, a semiconductor (e.g., silicon, germanium, etc.) layer 120 can be formed on top of the substrate 110 using any conventional method.

Next, in one embodiment, a dielectric layer 130 can be formed on top of the semiconductor layer 120 by, illustratively, thermal oxidation.

Next, in one embodiment, a nitride layer 140 can be formed on top of the dielectric layer 130 by, illustratively, chemical vapor deposition (CVD).

Next, in one embodiment, a patterned photoresist layer 145 can be formed on top of the nitride layer 140 by, illustratively, a lithography process.

Figure 1B:
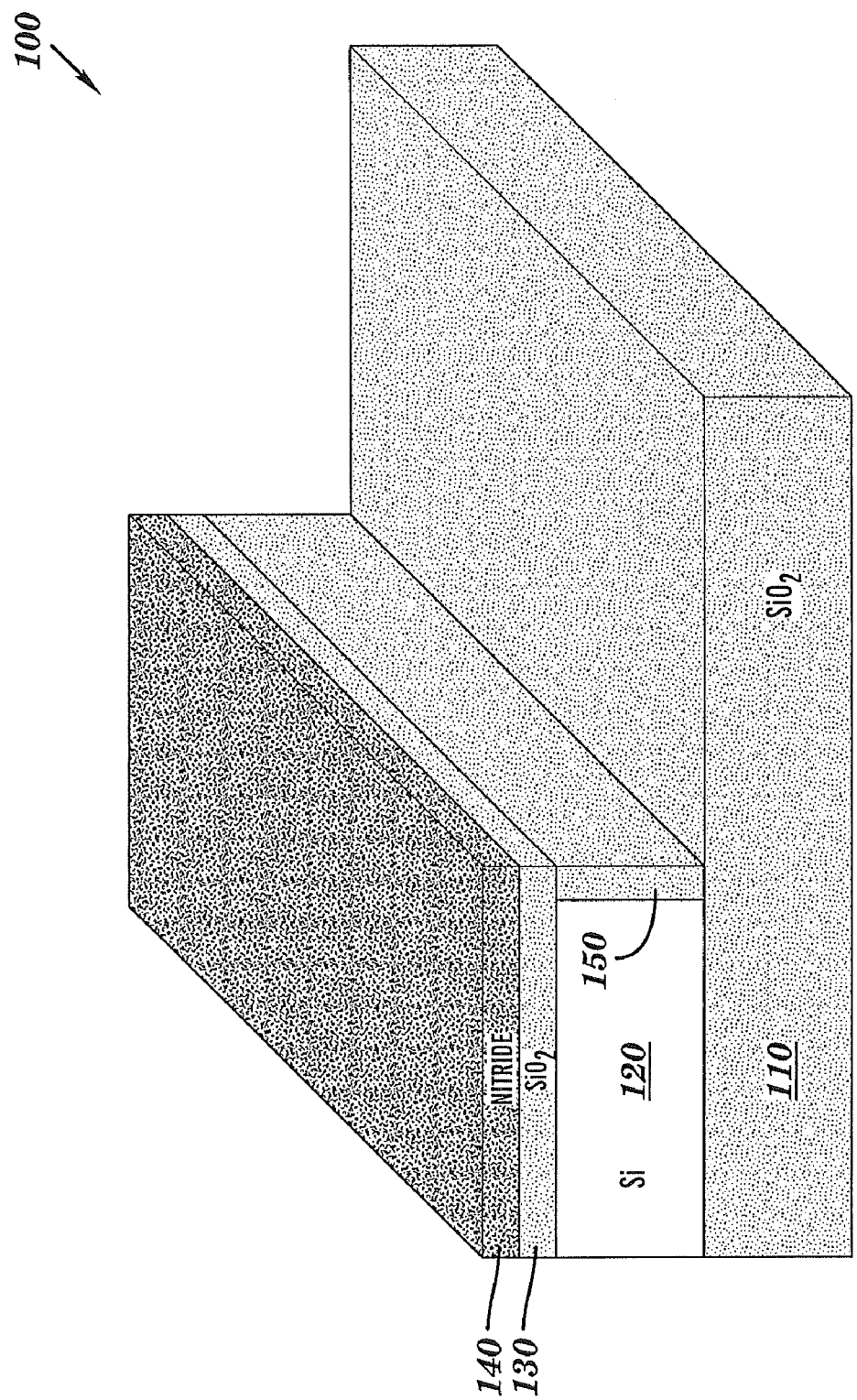

Next, in one embodiment, the patterned photoresist layer 145 can be used as a mask to etch away only uncovered portions of the nitride layer 140, then etch away only uncovered portions of the dielectric layer 130, and then etch away only uncovered portions of the semiconductor layer 120 followed by the removal of the patterned photoresist layer 145. The resulting structure 100 is shown in FIG. 1B. After these etching steps, what remains of the semiconductor layer 120 can be referred to as the semiconductor region 120 (FIG. 1B).

Next, with reference to FIG. 1B, in one embodiment, the method continues with the step of forming a gate dielectric region 150 on a side wall 122 of the semiconductor region 120. In one embodiment, the gate dielectric region 150 can be formed by thermal oxidation.

Figure 1C:
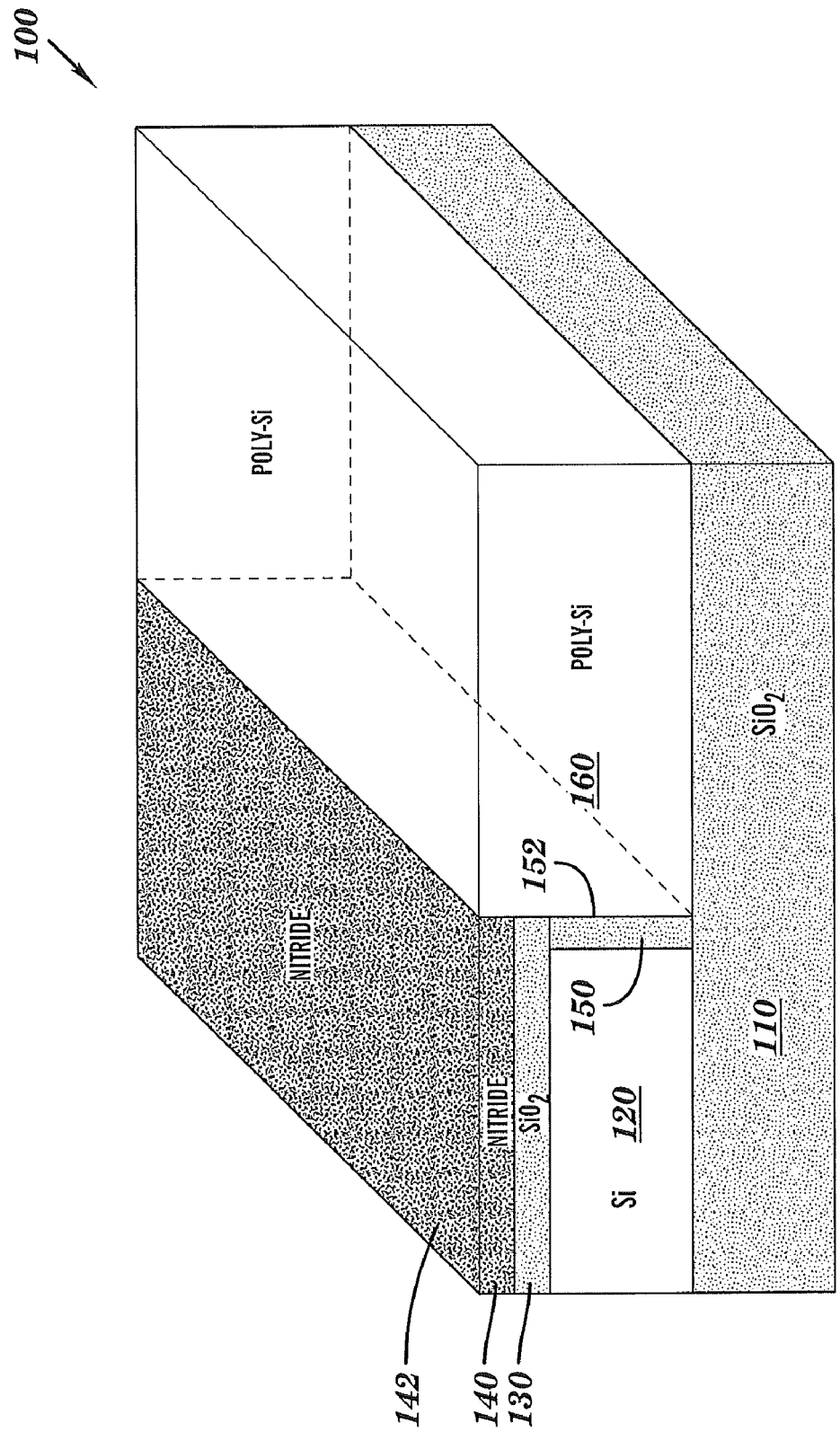

Next, with reference to FIG. 1C, in one embodiment, a gate block 160 is formed on top of the substrate 110 and on a side wall 152 of the gate dielectric region 150. In one embodiment, the gate block 160 can comprise poly-silicon. In one embodiment, the gate block 160 can be formed by depositing a gate layer of poly-silicon (not shown) on top of the entire structure 100 of FIG. 1B and then planarizing a top surface of the gate layer until a top surface 142 of the nitride layer 140 is exposed to the atmosphere.

Figure 1D:
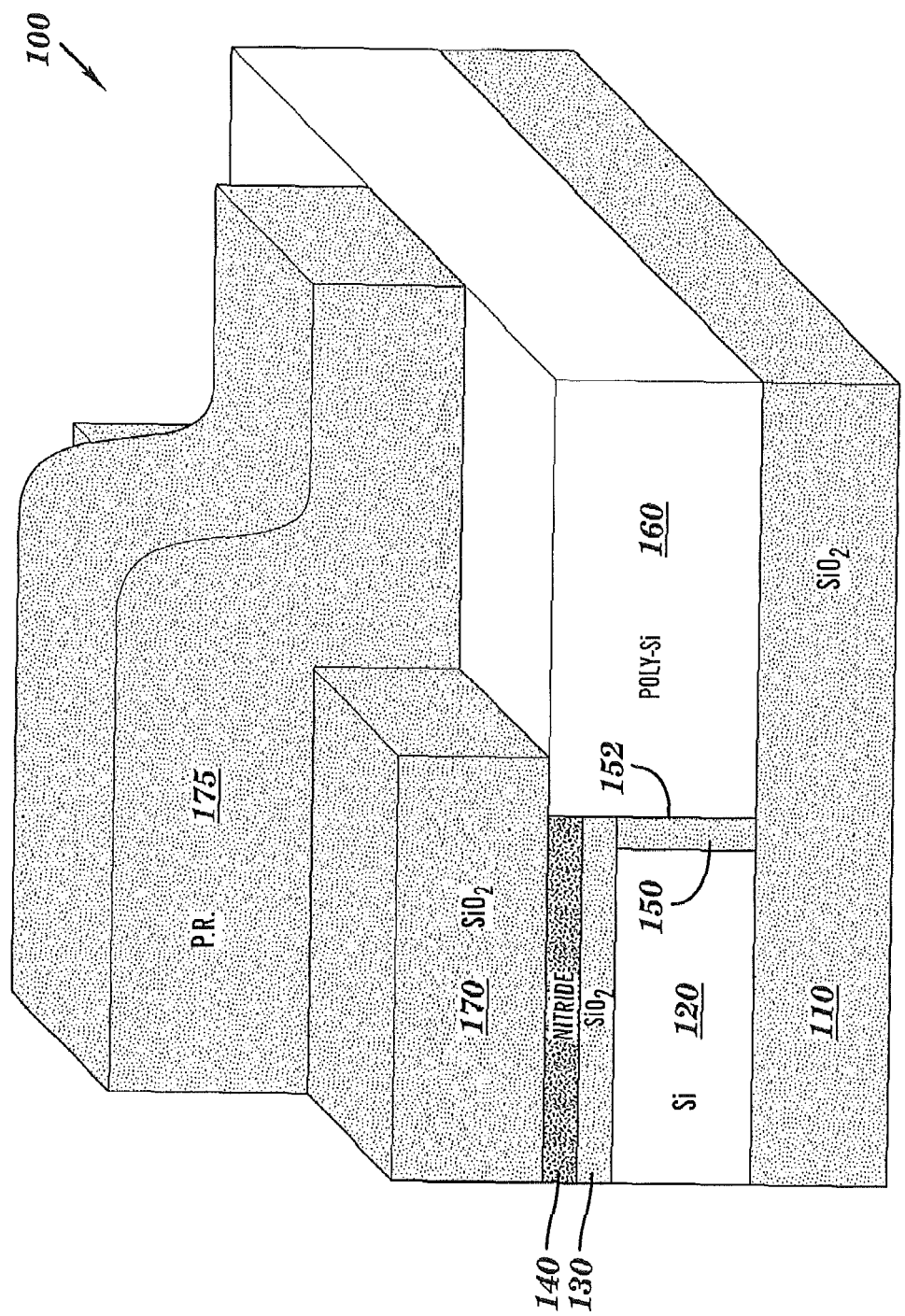

Next, with reference to FIG. 1D, in one embodiment, a channel cap block 170 can be formed on top of the nitride layer 140 and on a portion of the gate block 160. In one embodiment, the channel cap block 170 can comprise a dielectric material such as silicon dioxide. In one embodiment, the channel cap block 170 can be formed by a lithography process.

Next, in one embodiment, a patterned photoresist layer 175 can be formed on top of the channel cap block 170 and the gate block 160, using, illustratively, a lithography process.

Figure 1E:
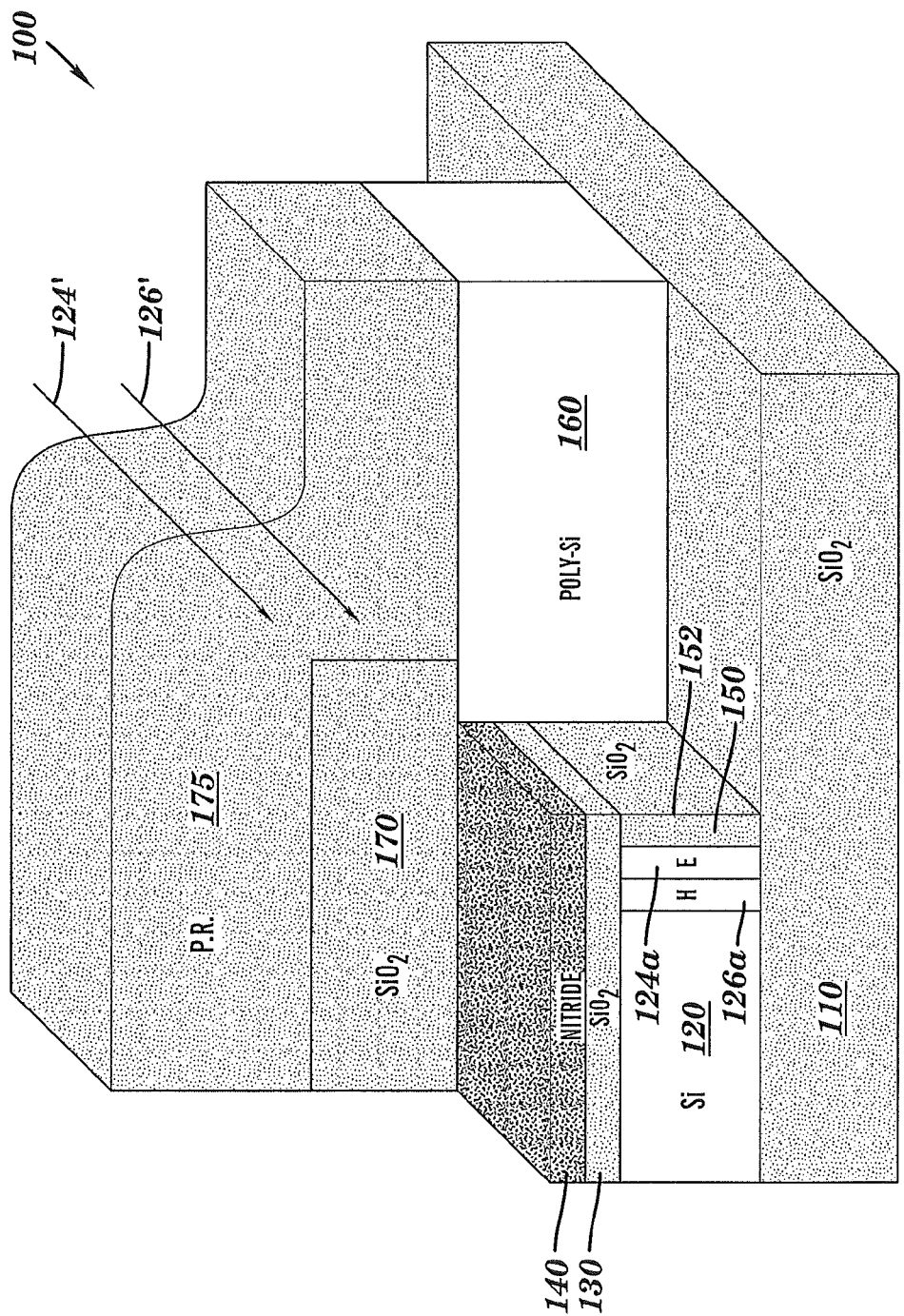

Next, in one embodiment, the patterned photoresist layer 175 can be used to etch away only uncovered portions of the channel cap block 170, and then etch away only uncovered portions of the gate block 160, resulting in the structure 100 of FIG. 1E. What remains of the channel cap block 170 after these etching steps can be referred to as the channel cap region 170. Also, what remains of the gate block 160 after these etching steps can be referred to as the gate region 160.

Next, with reference to FIG. 1E, in one embodiment, the patterned photoresist layer 175, the channel cap region 170, and the gate region 160 (which can be collectively referred to as the block 160,170,175) can be used as a mask to form extension regions 124a and 124b in the semiconductor region 120. The extension region 124b is behind the block 160,170,175 and is not shown in FIG. 1E for simplicity, but is shown in FIG. 1H. In one embodiment, the extension regions 124a and 124b can be formed by an extension implantation process represented by an arrow 124' whose direction also indicates the direction of the extension ion bombardment. Extension dopant concentration in regions 124a and 124b can range from 1e19 cm$^{-3}$ (i.e., $10^{19}$ atoms/cm$^3$) to 5e20 cm$^{-3}$ (i.e., $5\times10^{20}$ atoms/cm$^3$). For an n-type MOSEFET, n-type dopants, such as As (arsenic) and/or P (phosphorus), can be used for extension implantation. For a p-type MOSEFET, p-type dopants, such as B (boron) and/or In (indium), can be used for extension implantation. In one embodiment, the extension implantation process can be followed by an extension anneal process.

Next, in one embodiment, the block 160,170,175 can be used again as a mask to form halo regions 126a and 126b in the semiconductor region 120. The halo region 126b is behind the block 160,170,175 and is not shown in FIG. 1E for simplicity, but is shown in FIG. 1H. In one embodiment, the halo regions 126a and 126b can be formed by a halo implantation process represented by an arrow 126' whose direction also indicates the direction of the halo ion bombardment. Halo dopant concentration in regions 126a and 126b can range from 5e17 cm$^{-3}$ to 1e19 cm$^{-3}$. For an n-type MOSEFET, p-type dopants, such as B and/or In, can be used for halo implantation. For a p-type MOSEFET, n-type dopants, such as As and/or P, can be used for halo implantation. In one embodiment, the halo implantation process can be followed by a halo anneal process. Next, in one embodiment, the patterned photoresist layer 175 can be removed.

Figure 1F:
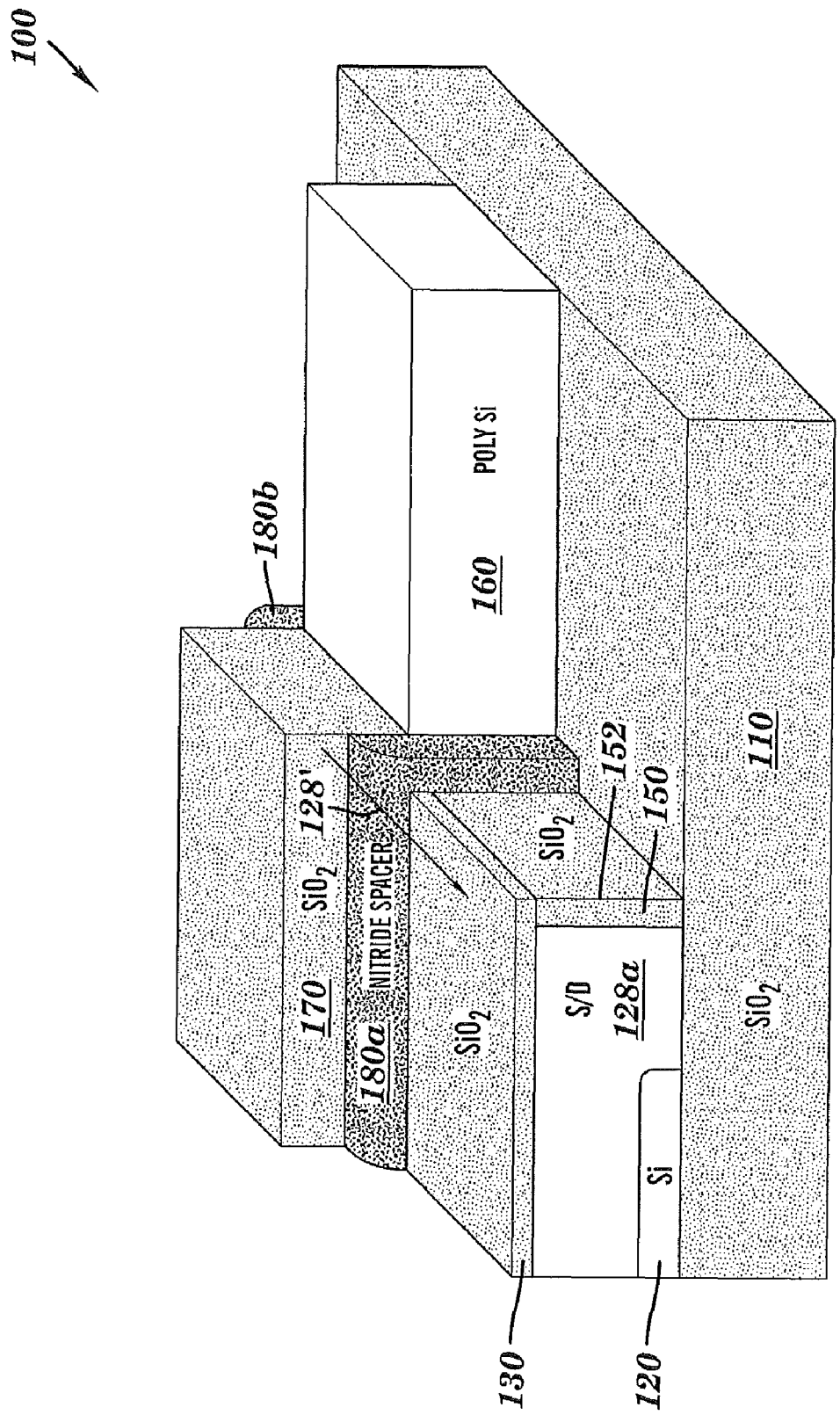

Next, with reference to FIG. 1F, in one embodiment, gate spacers 180a and 180b can be formed on side walls of the channel cap region 170 and of a portion the gate region 160. In one embodiment, the gate spacers 180a and 180b can be formed by depositing a nitride gate spacer layer (not shown) on top of the entire structure 100 of FIG. 1E (with the patterned photoresist layer 175 having been removed) and then etching back the nitride gate spacer layer.

Next, in one embodiment, the channel cap region 170, the gate region 160, and the gate spacers 180a and 180b (which can be collectively referred to as the block 160,170,180) can be used as a mask to form source/drain (S/D) regions 128a and 128b by implantation in the semiconductor region 120.

As a result, the S/D regions 128a and 128b are aligned with the gate region 160. In one embodiment, the S/D doping concentration in region 120 is higher than 1e19/cm$^{-3}$ so as to reduce junction capacitance. The S/D region 128b is behind the block 160,170,180 and is not shown in FIG. 1F for simplicity, but is shown in FIG. 1H. In one embodiment, the S/D regions 128a and 128b can be formed by an S/D implantation process represented by an arrow 128' whose direction also indicates the direction of S/D ion bombardment. S/D dopant concentration in regions 128a and 128b can range from 1e20 cm$^{-3}$ to 5e20 cm$^{-3}$. For an n-type MOSEFET, n-type dopants, such as As and/or P, can be used for S/D implantation. For a p-type MOSEFET, p-type dopants, such as B and/or In, can be used for S/D implantation. In one embodiment, the S/D implantation process can be followed by an S/D anneal process.

Figure 1G:
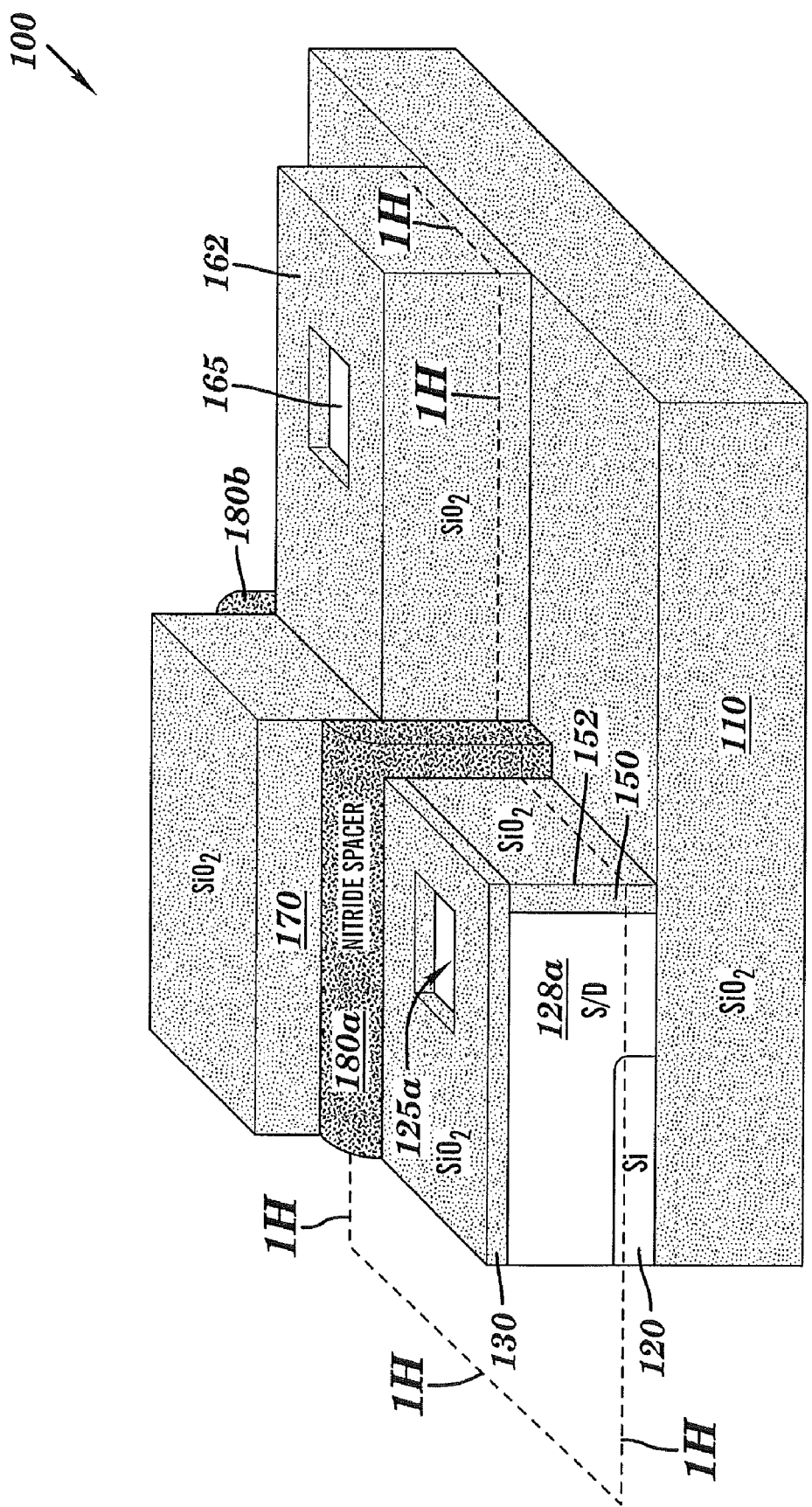
Figure 1H:
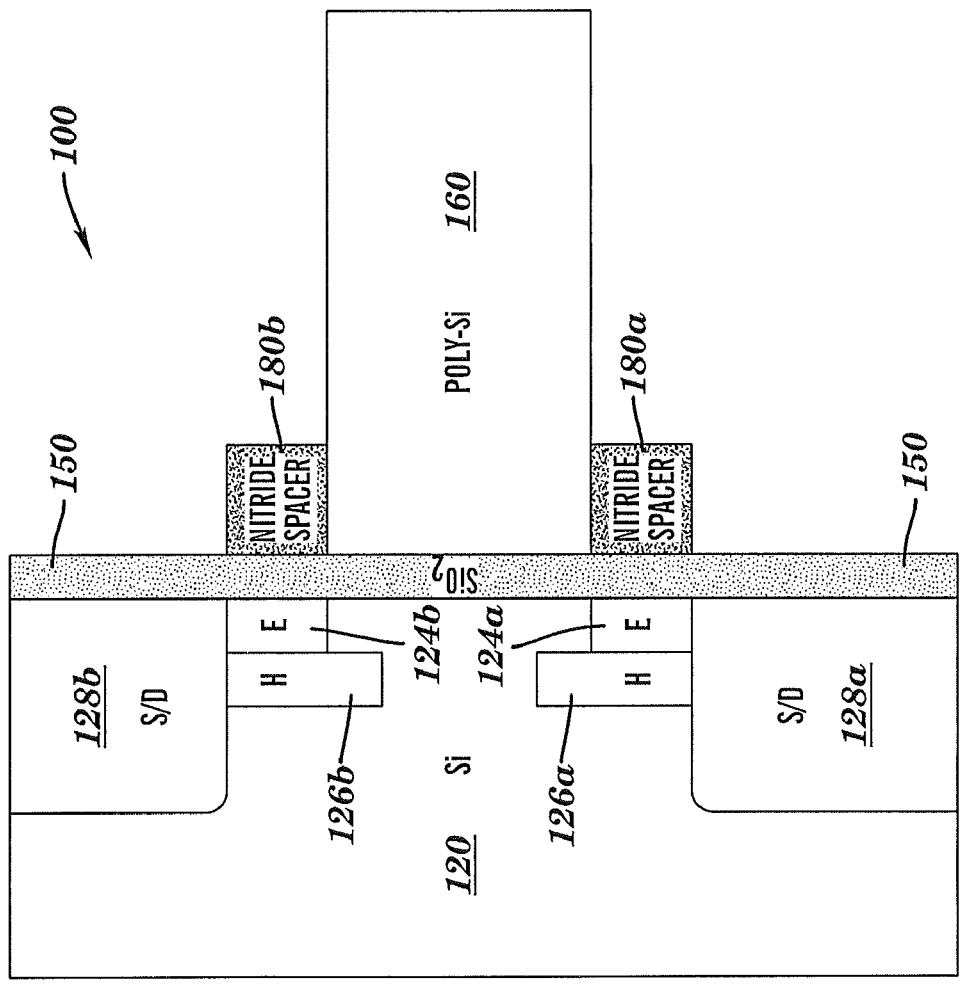
FIG. 1H shows a top view of the semiconductor structure of FIG. 1G along the plane 1H, in accordance with embodiments of the present invention.

Next, with reference to FIG. 1G, in one embodiment, a dielectric gate cover 162 can be formed on top and on side walls of the gate region 160 of FIG. 1F. In one embodiment, the dielectric gate cover 162 (~5-10 nm thick) can be formed by thermally oxidizing exposed-to-the-atmosphere surfaces of the structure 100 of FIG. 1F. Alternatively, the dielectric gate cover 162 can be formed by CVD (chemical vapor deposition) deposition of a thin nitride layer (~10-20 nm thick) on top and on side walls of the gate region 160 of FIG. 1F.

Next, in one embodiment, a gate contact hole 165 can be formed in the dielectric gate cover 162, and S/D contact holes 125a and 125b can be formed in the dielectric layer 130. The S/D contact hole 125b is behind the block 160,170,180 and is not shown for simplicity. In one embodiment, the S/D contact holes 125a and 125b can be formed symmetrically with respect to the block 160,170,180.

Next, in one embodiment, conventional gate contact and S/D contact processes can be used to form gate contact region and S/D contact regions (not shown, but located in the respective contact holes). In one embodiment, the gate contact region and the S/D contact regions can comprise a silicide such as platinum silicide, NiSi, or CoSi$_2$. In one embodiment, metal wires (not shown) can be formed directly attached to these silicide gate contact regions and S/D contact regions so that the underlying gate region 160 and the S/D region 128a and 128b can be electrically accessed.

FIG. 1H shows a top view of the semiconductor structure 100 of FIG. 1G along the plane 1H, in accordance with embodiments of the present invention.

With reference back to FIG. 1G, the gate contact hole 165 can be formed away from the semiconductor region 120 (i.e., moved to the right). As a result, the distance between the gate contact region and the S/D contact regions are greater resulting in lower capacitances between the gate contact region and the S/D contact regions. Moreover, comparing with conventional planar MOSFET, this structure has less chance of shorting between S/D via and gate conductor.

With reference back to FIG. 1E, the gate region 160 is formed on the sidewall 152 of the gate dielectric region 150. Therefore, the structure 100 can be referred to as sidewall semiconductor transistor with small overlap capacitance.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method for fabricating a semiconductor structure, the method comprising:

providing a substrate, a semiconductor region, a gate dielectric region, and a gate block,
wherein the semiconductor region, the gate dielectric region, and the gate block are on the substrate,
wherein the gate dielectric region is sandwiched between the semiconductor region and the gate block,
wherein the semiconductor region is electrically insulated from the gate block by the gate dielectric region,
wherein the semiconductor region and the gate dielectric region share an interface surface which is essentially perpendicular to a top surface of the substrate, and
wherein the semiconductor region and the gate dielectric region do not share any interface surface that is essentially parallel to a top surface of the substrate;

forming a channel cap region over a portion of the semiconductor region and over and in contact with only a first portion of a top surface of the gate block, said top surface of the gate block comprising a first portion and a second portion;

forming a gate region from the gate block; and forming first and second source/drain regions in the semiconductor region, wherein the first and second source/drain regions are aligned with the gate region.

2. The method of claim 1, wherein said providing comprises:

forming the semiconductor region on the substrate;
forming the gate dielectric region on a side wall of the semiconductor region; and
forming the gate block on a side wall of the gate dielectric region.

3. The method of claim 2, wherein said forming the gate dielectric region on the side wall of the semiconductor region is performed by thermal oxidation.

4. The method of claim 2, wherein said forming the gate block on the side wall of the gate dielectric region comprises:

forming a gate layer on the semiconductor region, the gate dielectric region, and the substrate; and
planarizing a top surface of the gate layer until essentially no portion of the gate layer is directly above the semiconductor region.

5. The method of claim 1, further comprising:

after said forming the gate region is performed, using the channel cap region and the gate region as a mask to form first and second extension regions in the semiconductor region, wherein the first and second extension regions are on opposing sides of the channel cap region.

6. The method of claim 5, wherein said forming the channel cap region comprises:
forming a channel cap block on the semiconductor region and on a portion of the gate block,
forming a patterned photoresist layer on the channel cap block and the gate block, and
using the patterned photoresist layer as a mask to etch away portions of the channel cap block so as to form the channel cap region, and
wherein said forming the gate region comprises using the patterned photoresist layer as a mask to etch away portions of the gate block so as to form the gate region.

7. The method of claim 5, further comprising using the channel cap region and the gate region as a mask to form first and second halo regions in the semiconductor region adjacent to the first and second extension regions, respectively.

8. The method of claim 5, wherein said forming the first and second source/drain regions comprises:

forming gate spacers on side walls of the channel cap region and the gate region; and
using the gate spacers, the channel cap region, and the gate region as a mask to form the first and second source/drain regions in the semiconductor region.

9. The method of claim 8, wherein said forming the gate spacers comprises:

forming a gate spacer layer on the channel cap region, the gate region, the semiconductor region, the gate dielectric region, and the substrate; and
etching back the gate spacer layer.

10. The method of claim 1, further comprising forming a gate contact region on and in direct physical contact with the gate region, wherein the gate contact region and the gate region share an interface surface which is essentially parallel to a top surface of the substrate.

11. The method of claim 1, further comprising forming a first source/drain contact region on and in direct physical contact with the first source/drain region, wherein the first source/drain contact region and the first source/drain region share an interface surface which is essentially parallel to a top surface of the substrate.

12. The method of claim 11, further comprising forming a second source/drain contact region on and in direct physical contact with the second source/drain region, wherein the second source/drain contact region and the second source/drain region share an interface surface which is essentially parallel to a top surface of the substrate.

13. A method for fabricating a semiconductor structure, the method comprising:

providing a substrate, a semiconductor region, a gate dielectric region, and a gate block,
wherein the semiconductor region, the gate dielectric region, and the gate block are on the substrate,
wherein the gate dielectric region is sandwiched between the semiconductor region and the gate block,
wherein the semiconductor region is electrically insulated from the gate block by the gate dielectric region,
wherein the semiconductor region and the gate dielectric region share an interface surface which is essentially perpendicular to a top surface of the substrate, and
wherein the semiconductor region and the gate dielectric region do not share any interface surface that is essentially parallel to a top surface of the substrate;

forming a channel cap region over a portion of the semiconductor region and over and in contact with only a first portion of a top surface of the gate block, said top surface of the gate block comprising a first portion and a second portion;

forming a gate region from the gate block; and using a mask comprising the gate region to form first and second source/drain regions in the semiconductor region.

14. The method of claim 13, wherein the substrate comprises a dielectric material.

15. The method of claim 13, further comprising forming a gate contact region on and in direct physical contact with the gate region, wherein the gate contact region and the gate region share an interface surface which is essentially parallel to a top surface of the substrate.

16. The method of claim 1, wherein said semiconductor region is independent from said substrate.

17. The method of claim 1, further comprising:
  forming a first dielectric layer over and in contact said semiconductor region; and
  forming a second dielectric layer over and in contact with said first dielectric layer such that said first dielectric layer and said second dielectric layer are sandwiched between said semiconductor region and said channel cap region.

18. The method of claim 17, wherein a portion of a bottom surface of said first dielectric layer is formed over and in contact with a portion of said gate dielectric region.

19. The method of claim 6, wherein said patterned photoresist layer comprises a curved multiplaner top surface.

* * * * *